United States Patent
Nelson et al.

(10) Patent No.: US 6,406,551 B1
(45) Date of Patent: Jun. 18, 2002

(54) METHOD FOR TREATING A SUBSTRATE WITH HEAT SENSITIVE AGENTS

(75) Inventors: Steven L. Nelson; Kurt K. Christenson, both of Minnetonka, MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/312,775

(22) Filed: May 14, 1999

(51) Int. Cl.⁷ .................................................. C23G 1/02
(52) U.S. Cl. ....................... 134/3; 134/1.3; 134/19; 134/26; 134/30; 134/32; 134/902
(58) Field of Search .............................. 134/1.3, 3, 19, 134/26, 32, 902, 30

(56) References Cited

U.S. PATENT DOCUMENTS

| | | |
|---|---|---|
| 932,898 A | 8/1909 | Place |
| 1,149,254 A | 8/1915 | Dumars |
| 2,812,861 A | 11/1957 | Bickford .............. 261/DIG. 42 |
| 2,876,188 A | 3/1959 | Thorp et al. ................. 204/176 |
| 3,555,783 A | 1/1971 | Grimshaw ..................... 55/48 |
| 3,590,902 A | 7/1971 | Walker et al. ....... 261/121.1 X |
| 3,650,151 A | 3/1972 | Drexel ................. 261/DIG. 65 |
| 3,653,182 A | 4/1972 | Welch .......................... 55/53 |
| 3,890,176 A | 6/1975 | Bolon .......................... 156/2 |
| 3,921,002 A | 11/1975 | Williams et al. ............ 250/533 |
| 3,935,041 A | 1/1976 | Goffredo et al. |
| 4,051,886 A | 10/1977 | Ross .................... 261/122.1 X |
| 4,105,725 A | 8/1978 | Ross ......................... 261/122 |
| 4,172,786 A | 10/1979 | Humphrey et al. ........... 210/57 |
| 4,176,206 A | 11/1979 | Inoue .......................... 427/82 |
| 4,220,460 A | 9/1980 | Partus ......................... 65/3 A |
| 4,276,243 A | 6/1981 | Partus ........................ 261/128 |
| 4,393,013 A | 7/1983 | McMenamin ................ 261/64 |
| 4,483,826 A | 11/1984 | Louthan .............. 261/DIG. 75 |
| 4,491,551 A | 1/1985 | Johnson ............... 261/122.1 X |
| 4,507,253 A | 3/1985 | Wiesmann ................... 261/22 |
| 4,540,531 A | 9/1985 | Moy .......................... 261/141 |
| 4,632,789 A | 12/1986 | Reid ........................... 261/63 |
| 4,666,480 A | 5/1987 | Mann ............................ 62/11 |
| 4,735,750 A | 4/1988 | Damann ...................... 261/29 |
| 4,749,640 A | 6/1988 | Tremont et al. ............ 430/314 |
| 4,817,652 A | 4/1989 | Liu et al. |
| 4,874,509 A | 10/1989 | Bullock ..................... 210/169 |
| 4,885,047 A | 12/1989 | Ury et al. ................... 156/345 |
| 4,900,336 A | 2/1990 | Pittner et al. ................. 55/55 |
| 4,973,379 A | 11/1990 | Brock et al. |
| 5,014,727 A | 5/1991 | Aigo .......................... 134/102 |
| 5,071,485 A | 12/1991 | Matthews et al. ............. 134/2 |
| 5,082,518 A | 1/1992 | Molinaro .................... 156/345 |
| 5,087,323 A | 2/1992 | Park |
| 5,100,521 A | 3/1992 | Schwarzl .................... 204/176 |
| 5,181,985 A | 1/1993 | Lampert et al. ............ 156/635 |
| 5,186,841 A | 2/1993 | Schick ....................... 210/760 |
| 5,215,592 A | 6/1993 | Jackson ........................ 134/1 |
| 5,221,423 A | 6/1993 | Sugino et al. .............. 156/643 |
| 5,242,468 A | 9/1993 | Clark et al. ................ 29/25.01 |
| 5,246,556 A | 9/1993 | Sawamoto et al. ......... 204/176 |
| 5,278,104 A | 1/1994 | Kodera et al. .............. 437/250 |
| 5,342,415 A | 8/1994 | Wasinger et al. ................ 8/111 |
| 5,378,317 A | 1/1995 | Kashiwase et al. ....... 156/659.1 |
| 5,415,191 A | 5/1995 | Mashimo et al. ......... 134/102.1 |
| 5,431,861 A | 7/1995 | Naahiro et al. ........... 261/140.1 |
| 5,447,640 A | 9/1995 | Omi et al. .................. 210/748 |
| 5,460,705 A | 10/1995 | Murphy et al. ............. 204/252 |
| 5,464,480 A | 11/1995 | Matthews .................... 134/1.3 |
| 5,503,708 A | 4/1996 | Koizumi et al. ........... 156/643.1 |
| 5,565,149 A | 10/1996 | Page et al. ................ 261/140.1 |
| 5,591,349 A | 1/1997 | Ikeda et al. ................ 210/760 |
| 5,624,734 A | 4/1997 | Rees et al. .............. 422/186.11 |
| 5,626,769 A | 5/1997 | Sawamoto .................. 210/760 |
| 5,632,847 A | 5/1997 | Ohno et al. ................. 156/344 |
| 5,674,410 A | 10/1997 | Nakajima et al. |
| 5,676,760 A | 10/1997 | Aoki et al. ................... 134/1.3 |
| 5,714,203 A | 2/1998 | Schellenberger et al. ... 427/378 |
| 5,756,054 A | 5/1998 | Wong et al. ............. 422/186.08 |
| 5,776,296 A | 7/1998 | Matthews ................... 156/345 |
| 5,843,307 A | 12/1998 | Faivre et al. ............... 210/192 |
| 5,896,875 A | 4/1999 | Yoneda .................... 134/102.3 |
| RE36,290 E | 9/1999 | Clark et al. ................ 29/25.01 |
| 5,971,368 A | 10/1999 | Nelson et al. .............. 261/64.3 |
| 6,080,531 A | 6/2000 | Carter et al. ................ 430/329 |
| 6,267,125 B1 | 7/2001 | Bergman et al. |
| 6,273,108 B1 | 8/2001 | Bergman et al. |

FOREIGN PATENT DOCUMENTS

| | | | |
|---|---|---|---|
| CA | 2142630 | 8/1996 | ............ A01G/7/00 |
| EP | 0 430 904 | 11/1989 | ............ C02F/1/78 |
| EP | 0 380 962 | 8/1990 | ............ C02F/1/78 |

(List continued on next page.)

OTHER PUBLICATIONS

Handbook of Semiconductor Wafer Cleaning Technology. Edited by Werner Kern. (ISBN 0–8155–1331–3) pp. 40, 51, 52, 77, 83, 128, 139.*

Tong, et al., Aqueous Ozone Cleaning of Silicon Wafers, FSI International Technical Report TR 376, Oct. 7, 1991, 7 pages.

(List continued on next page.)

*Primary Examiner*—Randy Gulakowski
*Assistant Examiner*—Michael Kornakov
(74) *Attorney, Agent, or Firm*—Kagan Binder, PLLC

(57) ABSTRACT

The present invention provides a method for treating a substrate, or a plurality of substrates, so that the treatment thereof is enhanced. In particular, the method includes the steps of causing a heated liquid to contact the substrate(s) and causing a processing liquid to contact the substrate(s). Although the processing liquid comprises a heat sensitive agent, the effectiveness of the processing liquid is not substantially diminished by the application of heat due to the fact that the heat is applied by the application of a separate heated liquid rather than by heating the processing liquid itself. Thus, the application of heat can be utilized to enhance the treatment rate of a substrate surface without a corresponding reduction in effectiveness of the processing liquid.

23 Claims, 3 Drawing Sheets

FOREIGN PATENT DOCUMENTS

| | | | |
|---|---|---|---|
| EP | 0 428 983 | 11/1990 | |
| EP | 0 548 596 | 11/1992 | |
| EP | 0 587 889 | 12/1992 | |
| EP | 0 550 152 | 7/1993 | ............. C02F/1/78 |
| EP | 0 640 933 | 8/1994 | |
| EP | 0 702 399 | 9/1995 | |
| EP | 0 867 924 | 1/1998 | |
| GB | 1 545 559 | 5/1979 | ............. B01F/3/04 |
| JP | 60-114393 | 6/1985 | |
| JP | 62-221426 | 9/1987 | |
| JP | 01-130785 | 5/1989 | |
| JP | 1-257103 | 10/1989 | |
| JP | 1306787 | 12/1989 | |
| JP | 03-089995 | 4/1991 | |
| JP | 03-154690 | 7/1991 | |
| JP | 04-346895 | 12/1992 | |
| JP | 06-182366 | 7/1994 | |
| JP | 6277476 | 10/1994 | |
| JP | 8045886 | 2/1996 | |
| WO | WO 96/01593 | 1/1996 | ........... A61B/19/00 |
| WO | WO 97/26308 | 7/1997 | ............ C09K/3/00 |
| WO | WO 98/46340 | 10/1998 | ............. B01F/3/04 |
| WO | 99/52654 | 10/1999 | |

OTHER PUBLICATIONS

Kogure et al., Ozonized Ultrapure Water Treatment of Organic Contamination on Si–Wafer Surface, Institute of Environmental Sciences 1993 Proceedings, pp. 380–385.

Hoigne, et al., The Role of Hydroxyl Radical Reactions in Ozonation Processes in Aqueous Solutions, Water Research vol. 10, 1975, pp. 377–387.

Kenens et al., Efficiency of Ozonated DI Water in Removing Organic Contamination, 9 pages.

Fukazawa et al., An HF–$O_3$ Aqueous Solution for Silicon Wafer Cleaning, pp. 267–270.

Takano et al., Chemical Oxide Passivation for Very Thin Oxide Formation, Mat. Res. Soc. Symp. Proc. vol. 315, 1993, pp. 381–386.

Wei, et al., Ozone use for post–ashing resist stripping: Mechanisms and recent findings, 1997 Semiconductor Pure Water and Chemicals Conference, pp. 81–97.

Ohmi, Very high quality thin gate oxide formation technology, J. Vac. Sci. Technol. vol.\_, 1995, pp. 1665–1670.

* cited by examiner

METHOD FOR TREATING A SUBSTRATE WITH HEAT SENSITIVE AGENTS

TECHNICAL FIELD

The present invention relates to a method for treating a substrate with heat sensitive agents. More particularly, the invention relates to a method of treating a substrate, e.g., by removing materials from the substrate surface, as in stripping, cleaning, etching and the like or by the addition of material, as by oxidizing the substrate surface, by contacting the substrate surface with both a heated liquid and a separate processing liquid comprising a heat sensitive agent. By utilizing a separate heated liquid to heat the substrate, rather than heating the processing liquid itself, the heat sensitive agent in the processing liquid is not detrimentally affected, and thus, enhanced treatment of the substrate can be achieved.

BACKGROUND OF THE INVENTION

Ozone has long been recognized as a useful chemical commodity valued particularly for its outstanding oxidative activity. In fact, ozone is the fourth strongest oxidizing chemical known, having an oxidation potential of 2.07 volts. Because of this property, ozone and/or fluid mixtures including ozone are capable of removing a wide variety of contaminants, such as cyanides, phenols, and detergents, from surfaces. Also, ozone and/or fluid mixtures including ozone are capable of oxidizing surfaces.

Because of this wide range of activity, ozone finds application in many diverse processes. For example, ozone is useful for inhibiting, reducing and/or eliminating the accumulation of biomass, mold, mildew, algae, fungi, bacterial growth and scale deposits in various aqueous solution systems. As a result, ozone has been used as a biocide for the treatment of drinking water, as well as a sterilization agent in the brewing industry. When used in these applications, ozonation provides the advantage of producing a lesser quantity of potentially harmful residues than, e.g., chlorination, which leaves undesirable chlorinated residues in aqueous systems.

Ozonated water also finds wide utility in the semiconductor industry, where for example, ozone is used to "clean", i.e., oxidize, and surface condition the surface of in-process silicon wafers. Additionally, as is described in U.S. Pat. No. 5,378,317, ozonated water is used to remove organic materials, such as photoresist, from the surface of silicon wafers. Moreover, ozonated water may also be used to form a thin, passivating oxide layer on the surface of silicon wafers.

The use of ozonated water provides several advantages in these applications. First of all, because ozonated water is generated at the point of use, it is free of contaminants, i.e., particles and metals, that are typically present in chemicals that are stored in barrels or drums. Ozonated water is also less expensive than other oxidizing chemicals and furthermore, since ozonated water naturally decomposes, the use of ozonated water presents no disposal issues.

However, while ozonated water provides significant processing advantages, the effectiveness of ozone in each of these applications can be adversely affected by its low solubility and short-half life (approximately 10 minutes) in aqueous solutions. That is, not only is it difficult to dissolve ozone in an aqueous solution, but also, once dissolved, it is difficult to maintain the ozone in solution. Furthermore, the difficulties of achieving and maintaining a desired concentration of ozone in solution can be exacerbated in certain applications by the utilization or optimization of other processing parameters, such as pressure, flow rate and temperature, that can have an adverse affect on the solubility of ozone.

For example, in certain applications, such as the stripping of certain types of photoresist materials, it would be desirable to add heat to the processing system in order to accelerate the reaction kinetics and thus provide a faster rate of stripping of the photoresist material. However, heating a processing liquid comprising ozone may have the effect of undesirably diminishing the concentration of ozone in solution inasmuch as the increased temperature may cause an amount of ozone to effervesce out of solution. If too much ozone effervesces out of solution, the processing liquid solution may exhibit reduced stripping effectiveness. As a result, the enhanced rate of stripping that could otherwise desirably be achieved via the application of heat may be attenuated, negated, or the rate of stripping may even be reduced below the unenhanced rate, by the reduced stripping effectiveness of the ozonated solution.

Thus, it would be desirably to identify a method of treating substrates utilizing one or more processing liquids comprising heat sensitive agents such as ozone in which the temperature of the process could be optimized to realize enhanced treatment effectiveness, without detrimentally affecting the effectiveness of processing liquids.

SUMMARY OF THE INVENTION

According to the present invention, the above objectives and other objectives apparent to those skilled in the art upon reading this disclosure are attained by the present invention which is drawn to a method for treating a substrate. More specifically, it is an object of the present invention to provide a method wherein certain processing parameters that may otherwise have a detrimental affect on the effectiveness of the processing liquid(s) utilized in the method, such as the application of heat, may be utilized and/or optimized to achieve an enhanced treatment rate while not producing the predicted reduction in effectiveness of the processing liquid.

In particular, it has now been discovered that treatments involving heat sensitive agents may be carried out more effectively at higher temperatures by causing both a processing liquid comprising one or more heat sensitive agent (s) and a separate heated liquid to contact a substrate to be desirably treated with the processing liquid. Because the substrate is heated by the heated liquid, and further because the processing fluid is not substantially directly or indirectly heated for a long enough period of time prior to treatment, the effectiveness of the processing liquid is not substantially reduced. Thus, the method of the present invention provides a means of realizing the benefits that accompany the application of heat to a processing system, i.e., increased reaction kinetics, while also utilizing a processing liquid comprising a heat sensitive agent without a corresponding undue reduction in effectiveness of the processing liquid. In this manner, the method of the present invention is capable of producing enhanced treatment rates of substrates.

Thus, in one aspect, the present invention provides a method for treating a substrate. Generally, the method involves causing a heated liquid to contact the substrate in a manner effective to heat at least a portion of the substrate and causing a processing liquid comprising a heat sensitive agent dispersed and/or dissolved in a solvent to contact the heated substrate. Because the substrate is heated, an enhanced treatment rate of the substrate can be achieved. Furthermore, because the processing liquid is not substantially directly or indirectly heated for a long enough period of time prior to treatment, the effectiveness of the processing liquid is not substantially diminished, thereby further adding to the treatment effectiveness.

Advantageously, the method of the present invention is capable of heating a substrate, or plurality of substrates, substantially uniformly. As a result, the method of the present invention has proven to be particularly useful when utilized in spray processing systems to process a plurality of substrates such as semiconductor wafers. Therefore, in another aspect, the present invention provides a method of treating a plurality of substrates. In particular, the method involves positioning the plurality of substrates in a chamber and causing a spray of a heated liquid and a spray of a processing liquid comprising a heat sensitive agent to contact the plurality of substrates. Again, because the heat is brought to the treatment by the heated liquid, the rate of treatment is enhanced over that achieved when no heat is applied. Furthermore, because the processing liquid itself is not heated to a sufficient degree for a long enough period of time prior to treatment, the effectiveness of the processing liquid is not substantially diminished thus further contributing to the enhanced treatment rate.

As used herein, the term "ozonated" means that ozone is dispersed and/or dissolved in a given solvent. The phrase "ultrapure deionized water", as used herein, is meant to indicate water that has been treated by, for example, filtering, reverse osmosis, and/or UV sterilization so as to remove particles, metals and organic materials, respectively. Also, as used herein, the phrase "heat sensitive agent" means an agent whose physical or chemical properties are altered by a change in temperature. One example of a heat sensitive agent is ozone, the solubility of which typically decreases with an increase in temperature.

BRIEF DESCRIPTION OF THE DRAWINGS

The above mentioned and other advantages of the present invention, and the manner of attaining them, will become more apparent, and the invention itself will be better understood, by reference to the following description of the embodiments of the invention taken in conjunction with the accompanying drawings, wherein.

DETAILED DESCRIPTION OF THE PRESENTLY PREFERRED EMBODIMENTS

Figure 1:
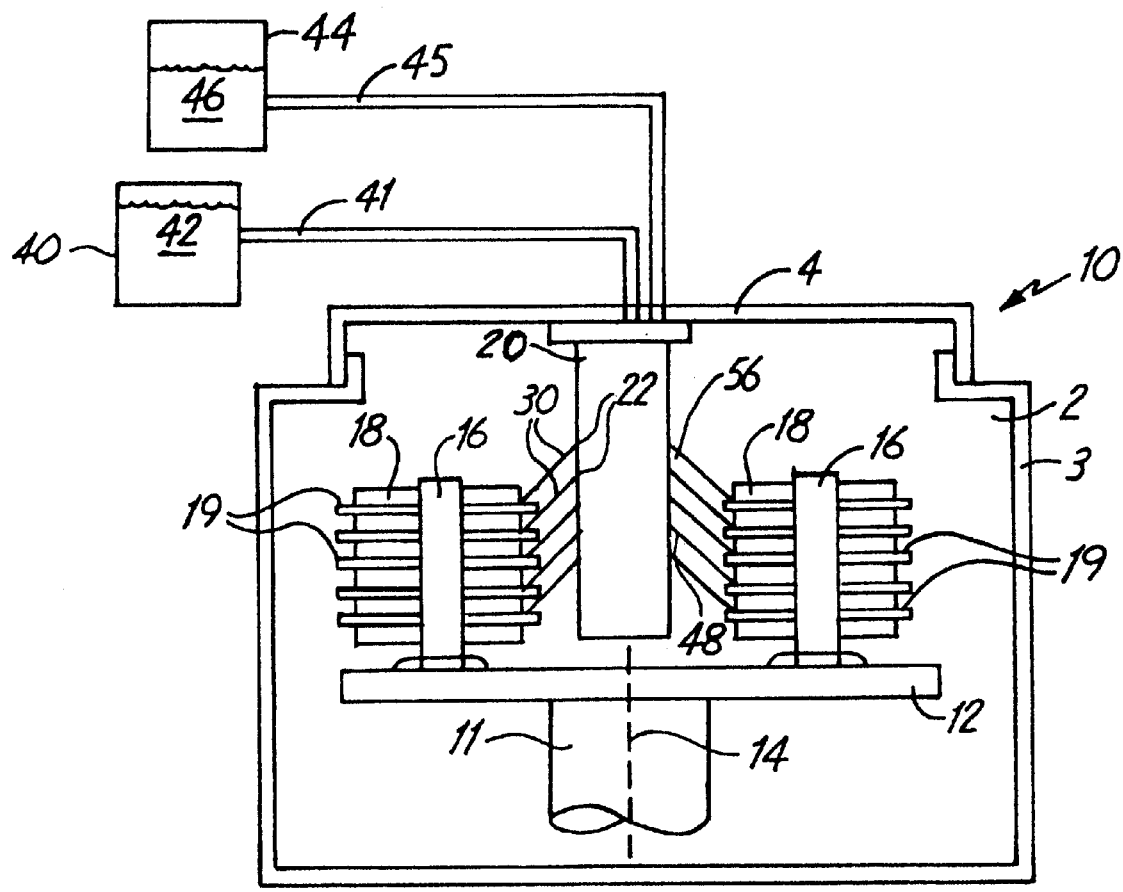
FIG. 1 is a schematic side view of a centrifugal spray processor having a center spray post for dispensing a processing liquid and a heated liquid at a semiconductor wafer surface in accordance with the method of the present invention.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The present invention provides a method for the treatment of a substrate, or a plurality of substrates. In particular, the present invention provides a method wherein certain processing parameters, such as the application of heat, that may otherwise have a detrimental affect on the effectiveness of one or more processing liquid(s) utilized in the method may be utilized and/or optimized to achieve an enhanced treatment rate while not producing the predicted reduction in effectiveness of the processing liquid. That is, the method of the present invention provides a means by which heat can be applied to a system in order to produce enhanced reaction kinetics, a processing fluid comprising a heat sensitive agent may be utilized and enhanced treatment rates still achieved.

Generally, the method involves contacting the substrate(s) with a heated liquid in a manner effective to heat at least a portion of the substrate and further contacting the substrate(s) with a processing liquid that comprises a heat sensitive agent. Because the substrate is heated, an enhanced treatment rate of the substrate can be achieved. Furthermore, because the processing liquid itself is not directly or indirectly heated substantially for a long enough period of time prior to treatment, the effectiveness of the processing liquid is not substantially diminished. Thus, the enhanced treatment rate that can be achieved by heating the substrate is not substantially diminished by a reduction in effectiveness of the processing liquid as a consequence of the application of heat.

While not wishing to be bound by any theory, it is believed that the heat applied to the substrate in the form of the heated liquid does not transfer from the substrate to the processing liquid at a rate fast enough to have a substantial negative impact on the effectiveness of the processing liquid prior to the time that the desired treatment occurs. It is believed that this is also the case even in those embodiments of the invention wherein the heated liquid and the processing liquid contact each other after being dispensed but prior to contacting the substrate. That is, even if the heated liquid and the processing liquid are caused to contact each other for a brief period prior to contacting the substrate, or are caused to contact each other on the surface of the substrate, it is believed that the amount of heating that would occur would not occur for a sufficient amount of time to have a substantial detrimental impact on the processing liquid prior to the processing liquid treating the substrate. Thus, the treatment occurs at a higher temperature without the increased temperature substantially negatively impacting the processing liquid.

In addition to this benefit, the utilization of a heated liquid to heat a substrate while either simultaneously, sequentially or intermittently treating the substrate with a processing liquid comprising a heat sensitive agent has a number of positive effects on several other parameters that, in turn, effect the treatment rate or the quality of treatment. For example, contacting a substrate with a heated liquid in addition to a processing liquid has the effect of reducing the viscosity of the processing liquid, increasing the overall flow rate of the processing liquid over the surface of the substrate, and thus, increasing the sheeting velocity of the processing liquid near the surface of the substrate. As a result, more unconsumed heat sensitive agent is brought into contact with the substrate surface which increases the reaction rate of the heat sensitive agent with the substrate surface. In the event that the desired treatment is removal of material from the substrate surface, the increased flow rate and sheeting velocity also can have the effect of more quickly removing fragments of material which have been dislodged from the surface of the substrate by reaction with the heat sensitive agent.

The method of the present invention is applicable to any treatment process in which heat is desirably applied and yet it is also desired to use a processing liquid comprising a heat sensitive agent. For example, the method of the present invention may be utilized to clean, oxidize, etch, or strip the surface of a substrate, as well as to deposit additional layers onto the surface of the substrate.

The heated liquid utilized in the method of the present invention is not particularly restricted so long as it is compatible with the substrate and/or other processing liquid (s) utilized. Generally, the heated liquid may be any liquid that is capable of being heated to a temperature effective to transfer the desired level of heat, either radiantly, convectively, conductively, or via condensation on a surface, to the substrate(s) to be treated in accordance with the method of the present invention. Furthermore, the temperature of the heated liquid is not restricted, but rather, the heated liquid can be heated to any temperature at which the heated liquid remains a liquid, i.e., to any temperature below the boiling point of the heated liquid, so that the ability to cause directed uniform heating of one or more substrates via the application of one or more streams of heated liquid is retained.

Because of its wide availability, low cost, ease of incorporation into many manufacturing designs and lack of any safety or handling issues, water or ultrapure deionized water are presently preferred for use as the heated liquid in the method of the present invention. In those preferred embodiments where the heated liquid is water, the water (or ultrapure deionized water) is desirably heated to any temperature capable of heating at least a portion of the substrate which the water is caused to contact while not causing the water to boil, i.e. the water would desirably be heated to and/or at a temperature of from about 30° C. to about 99° C. prior to contacting the substrate.

The heated liquid may be caused to contact the substrate in any manner by which the heated liquid may transfer a sufficient amount of heat, either radiantly, convectively, conductively, or via condensation on a surface, to the substrate so that at least a portion of the substrate is heated. Preferably, the heated liquid is caused to contact the substrate in a manner that is substantially non-immersive, i.e., where the substrate is not substantially immersed in the heated liquid. Rather, it is preferred that the heated liquid is caused to flow across at least one surface of the substrate as by the heated liquid cascading onto the substrate from a source of heated liquid, by a substantially continuous fluid stream of the heated liquid being caused to contact the surface, by a stream of atomized droplets being caused to contact the surface, and the like. More preferably, the heated liquid is caused to contact the surface in a substantially continuous fluid stream.

The rate of flow of the heated liquid is not particularly restricted so long as the heated liquid is capable of at least partially heating the substrate at the particular flow rate chosen. As one example of flow rates of heated liquid that have been found to be sufficient for this purpose, when the method of the present invention is implemented in a centrifugal spray processor, such as a MERCURY® spray processor, discussed further hereinbelow, it is preferred that the heated liquid be delivered, and caused to flow across the substrate surface(s), at a flow rate of from about 5 liters per minute (1 pm) to about 15 l pm.

Additionally, the heated liquid may be caused to contact the substrate by directing the heated liquid in a direction substantially parallel to the surface of the substrate, or alternatively, and as has been found to be advantageous in certain preferred embodiments of the present invention, the heated liquid may be directed toward the substrate so as to impact the surface at an angle of incidence, defined herein as the smaller of the two angles between the substrate surface and the primary direction of travel of the fluid stream of heated liquid. For example, in that preferred embodiment of the invention wherein the heated liquid is heated deionized water, it has been found advantageous to cause the heated deionized water to contact the substrate at an angle of incidence of from about 0.5° about 60°, more preferably, from about 5 ° to about 40 °.

Furthermore, it is thought that, although contacting the substrate with the heated liquid may not cause the entire three dimensional mass of the substrate to heat uniformly throughout, it is believed that by heating a portion of the substrate by contact with the heated liquid, the surface or portion thereof of the substrate to be heated will be heated to a degree sufficient to provide for the enhanced treatment of the substrate. Thus, the heated liquid may be caused to contact any portion of the substrate. For example, in certain embodiments wherein it would be desirable to limit the contact of the heated liquid with the processing liquid, the heated liquid may be caused to contact a substantially different surface than the processing liquid. For example, in the case of a substantially planar substrate such as a semiconductor wafer, the heated liquid may be caused to primarily contact a bottom surface of the substrate while the processing liquid is caused to primarily contact an opposing, upper surface of the substrate.

Using a heated liquid to heat the substrate results in very uniform heating of the substrate surface, even when a plurality of substrates are heated. In fact, the method of the present invention finds particular utility in those applications wherein a plurality of substrates are desirably treated inasmuch as heating the plurality of substrates by contacting each of the plurality with a fluid stream of a heated liquid provides uniform heating not only on each individual substrate, but also from substrate to substrate.

The processing liquid utilized in the method of the present invention comprises a heat sensitive agent at least partially dispersed and/or dissolved in a solvent. Any heat sensitive agent may be employed in the processing liquid, including, but not limited to, acids, bases, detergents, etchants, oxidants, cleaning agents, stripping agents, catalysts, enhancing agents, combinations of these, and the like. In those embodiments of the invention wherein the treatment desirably results in the cleaning, oxidation or stripping of photoresist from the surface of the substrate, one exemplarly heat sensitive agent is ozone. Furthermore, any suitable solvent may be utilized in the processing liquid in accordance with the present invention. For example, when the heat sensitive agent is ozone, it is preferred that the solvent comprises water or ultrapure deionized water. More preferably, when the heat sensitive agent is ozone, the solvent is ultrapure deionized water.

The concentration of the heat sensitive agent utilized will, of course, depend on the particular heat sensitive agent that is selected. Generally speaking, the heat sensitive agent would be present in a concentration effective to achieve the desired result and can be selected in accordance with conventional practices. While the amount of heat sensitive agent utilized is not particularly limited, at some concentration it is contemplated that cost consideration will outweigh any enhanced activity that may be achieved by increasing the concentration, and thus, the addition of further amounts of heat sensitive agent to the processing liquid would not be cost conscious. Bearing these general considerations in mind, and for the purposes of illustration, when the heat sensitive agent is ozone, the ozone is desirably present in the processing liquid in an amount from about 5 parts per million (ppm) to about 100 ppm and more preferably in an amount from about 20 ppm to about 80 ppm.

The method of the present invention provides a means in which a processing liquid comprising a heat sensitive agent may be utilized to treat a substrate while allowing for the optimization of the temperature at the surface of the substrate to enhance the treatment rate. Because a heated liquid is utilized to heat the substrate, and further because the processing liquid is not substantially heated either directly or indirectly for a long enough period of time prior to treatment, the effectiveness of the processing liquid is not unduly detrimentally impacted. Although it is contemplated that a certain amount of heating of the processing liquid may take place once the processing liquid contacts the substrate, or by contact with the heated liquid immediately prior to or during contact with the substrate surface, it is believed that the amount of heating that occurs does not occur for a long enough period of time to negatively impact the effectiveness of the processing liquid, and thus, to negatively impact the treatment rate.

Because the heated liquid provides the heat for the treatment, the processing liquid may be substantially at ambient temperature, i.e., from about 20° C. to about 25° C., or may even be chilled, prior to contacting the substrate. This is advantageous in those embodiments of the invention wherein the selected heat sensitive agent exhibits increased solubility at lower temperatures, e.g., when the heat sensitive agent is ozone. In these embodiments of the invention, the concentration of the heat sensitive agent may be optimized by chilling the processing liquid to achieve a higher concentration of heat sensitive agent, thus providing a more effective processing liquid. Thus, advantageously, the method of the present invention allows the concentration of the ozone in the processing liquid to be optimized by chilling the processing liquid while the temperature of the substrate is also optimized allowing greatly enhanced removal or etching rates.

If the processing liquid is to be chilled, the temperature to which the processing liquid is to be chilled is not particularly restricted. Rather, the processing liquid may be chilled to any temperature at which the heat sensitive agent exhibits increased solubility or stability in the solvent of the processing liquid and at which temperature the processing liquid is still a liquid, i.e., to a temperature above the freezing point of the solvent of the processing liquid. For example, when the processing liquid comprises ozone dispersed and/or dissolved in ultrapure deionized water, increased concentrations of ozone can be achieved, and the freezing of the ultrapure deionized water can be avoided, by chilling the processing liquid to a temperature of from about 1° C. to about 20° C.

The processing liquid may be caused to contact the substrate in any manner by which the processing liquid may come into contact with the area of the substrate that is to be treated. As is the case with the heated liquid, the processing liquid may be caused to contact the substrate in any manner that is substantially non-immersive. Preferably, the processing liquid is caused to flow across at least one surface of the substrate, i.e., by cascading the processing liquid onto the substrate from a processing liquid source, by causing a substantially continuous fluid stream of the heated liquid to contact the substrate, by causing a stream of atomized droplets to contact the substrate, and the like. More preferably, the processing liquid is caused to contact the surface in a substantially continuous fluid stream.

The rate of flow of the processing liquid is not particularly restricted so long as the processing liquid is capable of at least partially treating the substrate at the particular flow rate chosen. As one example of flow rates of processing liquid that have been found to be sufficient for this purpose, when the method of the present invention is implemented in a centrifugal spray processor, such as a MERCURY® spray processor, discussed further hereinbelow, it is preferred that the heated liquid be delivered, and caused to flow across the substrate surface(s), at a flow rate of from about 1 l pm to about 20 l pm.

As is the case with the heated liquid, the processing liquid may be caused to contact the substrate by directing the processing liquid toward the substrate in a direction substantially parallel to the surface of the substrate, or alternatively, the processing liquid may be directed toward the substrate so as to impact the surface at an angle of incidence. For example, in that preferred embodiment of the invention wherein the processing liquid is ozonated deionized water, it has been found advantageous to cause the ozonated deionized water to contact the substrate at an angle of incidence of from about 0.5° to about 60°, more preferably, from about 5° to about 40°.

The heated liquid and the processing liquid may be caused to contact the substrate simultaneously, sequentially, intermittently, or wherein only a portion of the time of delivery of the heated liquid and the processing liquid overlap. Furthermore, the length of time that either the heated liquid and the processing liquid are delivered to the substrate is not critical, but rather can be selected by one of ordinary skill in the art in order to provide the desired result. That is, and in consideration of the selected flow rate of the heated liquid, the heated liquid should be delivered for a length of time sufficient to at least partially heat at least a portion of the substrate. Likewise, and in consideration of flow rate, the processing liquid should be delivered for a length of time sufficient to at least partially treat at least a portion of the substrate.

The method of the present invention could be utilized to treat any substrate. However, in preferred embodiments, the substrates that are to be treated are in-process semiconductor wafers. In this embodiment of the invention, the method is effective to clean, i.e., to remove organic contaminants, oxidize, etch, or strip, i.e., to remove photoresist materials, from the surface of the substrate(s). Furthermore, any other processes desirably applied to semiconductor wafers that are desirably carried out at temperatures greater than ambient temperature and in which it is desired to use a processing liquid comprising a heat sensitive agent could also benefit by being carried out according to the method of the present invention.

In some treatment applications, it has been found to be useful, i.e., has resulted in enhanced treatment rates, to rotate the substrate(s) that are being treated either about an axis of the substrate or about an axis external to the substrate(s). It is thought that this rotation produces centrifugal forces that result in enhanced contact between the processing liquid and/or heated liquid. One of ordinary skill in the art is capable of determining whether such rotation would produce an enhanced treatment rate in the particular treatment application, as well as determining an appropriate rate of rotation. While in that preferred embodiment of the present invention wherein the processing liquid is ozonated deionized water, the heated liquid is ultrapure deionized water and the substrate is an in-process semiconductor wafer comprising an amount of photoresist that is desirably removed enhanced removal rates have not been achieved by rotating the wafers, and in fact, reduced removal rates have been observed, it is contemplated that the method of the present invention could be used to effectuate other treatments in which rotation of the substrates would prove to be advantageous.

The method of the present invention may be implemented using any system capable of housing one or more substrates and delivering two or more chemicals sequentially or simultaneously. One exemplary system capably of carrying out the method of the present invention is the MERCURY® centrifugal spray processor, commercially available from FSI International, Chaska, Minn. In those embodiments of the invention wherein either one or both of the heated liquid and the processing liquid are caused to contact the substrate surface at an angle of incidence, the spray processor disclosed in the co-pending patent application entitled "APPARATUS AND METHOD FOR DISPENSING PROCESSING LIQUID TOWARD A SUBSTRATE SURFACE" with attorney docket number 15676-217184, filed May 14, 1999, may be used to implement the method of the present invention and the entire disclosure of this application is hereby incorporated by reference herein for all purposes.

Figure 2:
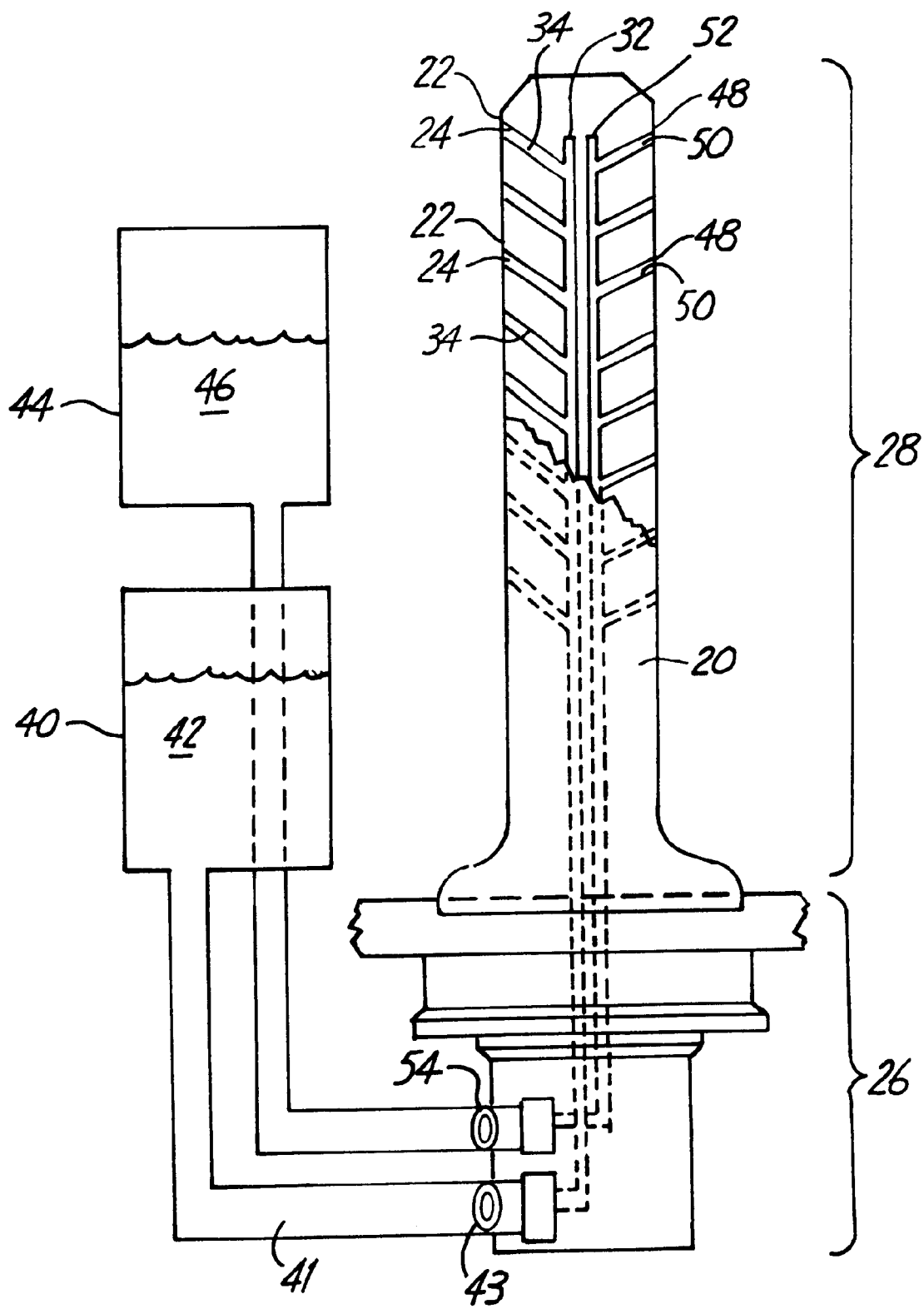
FIG. 2 is a side view of a spray post suitable for use in the centrifugal spray processor of FIG. 1 with portions broken away to illustrate the nozzles of the spray post.

Referring now to FIGS. 1 and 2, an exemplary centrifugal spray processor suitable for carrying out the method of the present invention is shown. Spray processor 10 includes processing chamber 2 defined by housing 3 and lid 4. A turntable 12 is rotatably mounted in processing chamber 2 upon shaft 11 such that turntable 12 is rotatable about axis 14 of shaft 11. Spray processor 10 includes a support, such as one or more uprights 16, that are adapted to receive one or more semiconductor wafers 19. In the embodiment shown, semiconductor wafers 19 are supported in cassette 18, which are received by uprights 16. Other structures for supporting semiconductor wafers 19 can of course be used.

Processor 10 further includes a spray post 20, which is fluidly coupled both to a reservoir 40 containing a processing liquid 42 and a reservoir 44 containing heated liquid 46. In the embodiment shown, spray post 20 is attached to lid 4 of processor 10, and is positioned at the center of turntable 12. In this manner, turntable 12 (and thus cassettes 18 and semiconductor wafers 19) may be caused to rotate independent of the spray post 20. Spray post 20 delivers processing liquid 42 onto wafers 19 through one or more nozzles 22 on spray post 20 and fluidly connected to reservoir 40 through supply line 41. Spray post 20 delivers heated liquid 46 onto wafers 19 through one or more nozzles 48 on spray post 20 and fluidly connected to reservoir 44 through supply line 45.

More particularly, during wafer processing, turntable 12 and cassettes 18 containing semiconductor wafers 19 may be caused to rotate about axis 14 of shaft 11 as processing liquid 42 and heated liquid 46 are sprayed onto the surface of wafers 19. The flow rates of processing liquid 42 and heated liquid 46, the rotation of the cassettes 18 and the centrifugal forces generated by the rotation distribute processing liquid 42 and heated liquid 46 over the surface of the semiconductor wafers 19.

As best seen in FIG. 2, spray post 20 includes a first plurality of nozzles 22 that include orifices 24 through which streams 30 of processing liquid 42 are dispensed and second plurality of nozzles 48, including orifices 50, through which streams 56 of heated liquid 46 are dispensed. Nozzles 22 and 48 are shown in a configuration capable of dispensing fluid streams of processing liquid and heated liquid in a manner so as to cause the fluid streams to contact the substrate surface at an angle of incidence. However, and as is mentioned hereinabove, nozzles 22 and 48 may also be oriented in a direction so that the fluid streams are dispensed in a direction substantially parallel to the substrate surface.

Spray post 20 further includes a mounting flange portion 26 that is coupled to processor 10, such as through lid 4 in the embodiment shown, and a nozzle portion 28. First plurality of nozzles 22 and a second plurality of nozzles 48 are distributed along a length of nozzle portion 28. First plurality of nozzles 22 are fluidly coupled to a reservoir 40 holding processing liquid 42 by longitudinal passage 32 that extends along the length of spray post 20. Longitudinal passage 32 can be fluidly coupled to supply line 41 at input 43 within flange portion 26 of spray post 20 to receive processing liquid 42 from reservoir 40 in a convenient manner. Second plurality of nozzles 48 are fluidly coupled to reservoir 44 holding heated liquid 46 by longitudinal passage 52 that extends along the length of spray post 20. Longitudinal passage 52 can be fluidly coupled to supply line 45 at input 54 within flange portion 26 of spray post 20 to receive heated liquid 46 from reservoir 44 in a conventional manner.

Orifices 24 of nozzles 22 are shaped to dispense processing liquid 42 in streams 30 that are inclined from a plane that is perpendicular to the longitudinal axis of spray post 20 (e.g. inclined from vertical in a typical embodiment). Nozzles 22 and their orifices 24 are preferably adapted to dispense processing liquid 42 in the form of a substantially continuous fluid stream. In alternative embodiments, nozzles 22 and their orifices 24 may be adapted to provide a stream of atomized droplets of processing liquid 42, i.e., by configuring nozzles 22 and their orifices 24 with spray jets, fan jets, or combinations thereof.

Likewise, orifices 50 of nozzles 48 are shaped to dispense heated liquid 46 in streams 56 that are inclined from a plane that is perpendicular to the longitudinal axis of spray post 20 (e.g. inclined from vertical in a typical embodiment). Nozzles 48 and their orifices 50 are preferably adapted to dispense heated liquid 46 in the form of a substantially continuous fluid stream. In alternative embodiments, nozzles 48 and their orifices 50 may be adapted to provide a stream of atomized droplets of heated liquid 46, i.e., by configuring nozzles 48 and their orifices 50 with spray jets, fan jets, or combinations thereof The present invention will now be further described with reference to the following examples.

EXAMPLE 1

8" silicon wafers coated with 9,800 Angstroms of TOK-3450-6cP photoresist (TOK-3450-6cP is commercially available from OHKA America Incorporated, Doylestown Pa.) were utilized for the strip rate experiments. The strip rate experiments were conducted in MERCURY® MP (multi-position) centrifugal spray processors, commercially available from FSI International, Chaska, Minn. with slight plumbing modifications. Specifically, the MP-B processor had been plumbed to dispense 1 to 2 liter/min flows of ozonated deionized water through the "solution line" (cleaning chemistry) flow system, by the addition of a valve to the line that typically supplies hot or cold deionized water, such that the line is also capable of supplying ozonated deionized water. The MP-D processor was plumbed to dispense 1 to 2 liter/min flows of ozonated deionized water through the "solution line" flow system in the same manner that the MP-B was so modified. To dispense up to 20 liters/min of ozonated deionized water from the center spray post, a dedicated plumbing system was also added to the MP-D processor. Specifically, the dedicated plumbing system that was added is commercially available from FSI International, Chaska, Minn. as part number 916536-001. The spray post to accommodate the plumbing is commercially available from FSI International, Chaska, Minn. as part number 427049001. The dedicated ozonated deionized water plumbing of the MP-D processor dispensed the ozonated deionized water through thirty-four (34), 0.070" holes in the spray post that were angled down 30° from horizontal.

More specifically, the strip experiments in MP-B processor utilized five (5) minute dispenses of ozonated deionized water containing 60 ppm by weight of ozone gas dissolved in deionized water at a flow rate of two (2) liters/min. The ozonated deionized water was plumbed as a chemical and dispensed through the solution line plumbing. The ozonated deionized water was dispensed through the chemical dispense plumbing either simultaneously or intermittently as shown in Table 1 with an amount of 95° C. deionized water through the wafer rinse plumbing. The flow rate of deionized water was varied from run to run, and the particular flow of deionized water in each run is shown below in Table 1. Specifically, in run 1, there was no flow of hot deionized water, and thus, this run acted as a control for the experiments conducted in this processor.

The strip experiments conducted in the MP-D processor utilized two (2) minute dispenses of ozonated deionized water containing 60 ppm by weight of ozone gas dissolved in deionized water at a flow rate of fourteen (14) liters/min through dedicated 0.070" orifices in the MP-D spray post that are angled down at 30° to direct most of the flow to the top surface of the wafer. 95° C. deionized water was simultaneously dispensed through the wafer rinse plumbing. The flow rate of deionized water was varied from run to run, and the particular flow of deionized water in each run is shown below in Table 1. Specifically, in run 5, there was no flow of hot deionized water, and thus, this run acted as a control for the experiments conducted in this processor.

The program parameters for each run are listed below. Pre-heat steps, i.e., a one (1) minute dispense of 95° C. deionized water through the wafer rinse plumbing, were utilized in conjunction with the runs that included hot deionized water mixed with ozonated deionized water as listed in Table 1.

Three programs were utilized to conduct the strip rate experiments in the MP-B processor. Each program is listed hereinbelow, with a general description of the treatment that is carried out at each step following the program code. Each of the following programs can be easily programmed into the commercially available processor, modified as described above, by following the manufacturer's instructions. The particular program called in each run is shown below on Table 1.

| Step | Time (secs) | RPM | Output Functions |
|---|---|---|---|
| 000 | 000 | 000 | 9 = 100, 100 = 2000 |
| 001 | 060 | 500 | 69, 93, 100 |
| 002 | 300 | 500 | 69, 100 |
| 003 . . . Rinse-dry sequence | | | |

Program I-1 does not call for the dispensing of hot deionized water and thus, the wafers processed utilizing this program served as controls for the strip experiments conducted in the MP-B processor. Basically, program I-1 provides that the wafers were treated as follows:

In step 0, the blanket heater in the lid of the chamber was set to 100% power and the flow of chemical 100, the ozonated deionized water, was set to 2,000 cc/mm.

In step 1, functions 69 and 100 activate the 2 liters/min flow of ozonated deionized water. Function 93 diverted the ozonated deionized water flow away from the wafers and directly to the drain. Step 2 charged the plumbing with fresh ozonated deionized water. The turn table carrying the wafers was caused to rotate at 500 rpm.

In step 2, 2 liters/min of ozonated deionized water was dispensed from the center spray post onto the wafers for 30 seconds.

Step 3 and following are the standard Rev H B Clean rinse-dry program sequence for FSI MERCURY® MP spray processors.

Program I-2 for the strip experiments conducted with the MP-B processor was as follows:

| Step | Time (secs) | RPM | Output Functions |
|---|---|---|---|
| 000 | 000 | 000 | 9 = 100, 100 = 2000 |
| 001 | 60 | 500 | 69, 93, 100 |
| 002 | 60 | 500 | 32, 48 |
| 003 | 300 | 500 | 48, 69, 100 |
| 004 . . . | | Rinse-dry sequence. | |

Basically, program I-2 provides that the wafers are treated as follows:

In step 0, the blanket heater in the lid of the chamber is set to 100% power (when the blanket heater function is called) and the flow of chemical 100 (ozonated deionized water) is set to 2,000 cc/min (when the ozonated deionized water function is called).

In step 1, functions 69 and 100 are called to activate the 2 liters/min flow of ozonated deionized water for 60 seconds. Function 93 diverts the ozonated deionized water flow away from the wafers and directly to the drain. Step 1 is intended to charge the plumbing with fresh ozonated deionized water. The turn table carrying the wafers is rotating at 500 rpm.

In step 2, 7 liters/min of 95° C. deionized water is dispensed on the wafers with atomization from the wafer rinse system for 60 seconds. Step 2 is intended to preheat the wafers.

In step 3, 2 liters/min of ozonated deionized water is dispensed from the center spray post onto the wafers for 300 seconds. Simultaneously, 7 liters/min of 95° C. deionized water is dispensed on the wafers from the wafer rinse system.

Step 4 and following are the standard Rev H B Clean rinse-dry program sequence for FSI MERCURY® MP spray tools.

Program I-3 for the strip experiments conducted with the MP-B processor was as follows:

| Step | Time (secs) | RPM | Output Functions |
|---|---|---|---|
| 000 | 000 | 000 | 9 = 100, 100 = 2000 |
| 001 | 060 | 500 | 69, 93, 100 |
| 002 | 60 | 500 | 32, 48 |
| 003 | 20 | 500 | 69, 100 |
| 004 | 10 | 500 | 48, 69, 100 |
| 005– | | Repeat the sequence of steps 003 | |
| 022 | | and 004 nine (9) times | |
| 023 . . . | | Rinse-dry sequence. | |

Basically, program 1-3 provides that the wafers are treated as follows:

In step 0, the blanket heater in the lid of the chamber is set to 100% power (when the blanket heater function is called) and the flow of chemical 100 (ozonated deionized water) is set to 2,000 cc/min (when the ozonated deionized water (DIO) function is called).

In step 1, functions 69 and 100 are called to activate the 2 liters/min flow of DIO for 60 seconds. Function 93 diverts the DIO flow away from the wafers and directly to the drain. Step 1 is intended to charge the plumbing with fresh DIO. The turn table carrying the wafers is rotating at 500 rpm.

In step 2, 7 liters/min of 95° C. deionized (DI) water is dispensed on the wafers with atomization from the wafer rinse system for 60 seconds. Step 2 is intended to preheat the wafers.

In step 3, 2 liters/min of DIO is dispensed from the center spray post onto the wafers for 10 seconds.

In step 4, 2 liters/min of DIO is dispensed from the center spray post onto the wafers for 20 seconds. Simultaneously, 7 liters/min of 95° C. DI water is dispensed on the wafers from the wafer rinse system.

Steps 3 and 4 are now repeated nine (9) more times. The 20 seconds on, 10 seconds off duty cycle of the 7 liters/min of hot DI water gives an average hot DI flow rate of 4.66 liters/min.

Step 23 and following are the standard Rev H B Clean rinse-dry program sequence for FSI MERCURY® MP spray tools.

Five programs were utilized to conduct the strip rate experiments in the MP-D processor. Each program is listed hereinbelow, with a general description of the treatment that is carried out at each step following the program code. Each of the following programs can be easily programmed into the commercially available processor, modified as described above, by following the manufacturer's instructions. The particular program called in each run is shown below on Table 1.

Program O3striphot1 for the strip experiments conducted with the MP-D processor was as follows:

| Step | Time (secs) | RPM | Output Functions |
|---|---|---|---|
| 000 | 060 | 060 | 38, 48 |
| 001 | 060 | 500 | 38, 48 |
| 002 | 120 | 500 | 38, 48, 59 |
| 003 . . . | | Rinse-dry sequence. | |

Basically, program O3striphot1 provides that the wafers were treated as follows:
In step 0, functions 38 and 48 were called to dispense a total of 9.5 liters/min of 95° C. hot deionized water from the hot wafer rinse and hot line rinse ports on the center spray post for one (1) minute. The turn table carrying the wafers was rotating at 60 rpm.
In step 1, the hot deionized water continues to dispense and the turn table is accelerated to 500 rpm.
In step 2, function 59 activated the fourteen (14) liters/min flow of ozonated deionized water for two (2) minutes. Simultaneously, functions 38 and 48 continued to dispense 9.5 liters/min of hot DI on the wafers.
Step 3 and following are the standard Rev H B Clean rinse-dry program sequence for FSI MERCURY® MP spray tools.

Program O3striphot2 for the strip experiments conducted with the MP-D processor was as follows:

| Step | Time (secs) | RPM | Output Functions |
|---|---|---|---|
| 000 | 060 | 060 | 48 |
| 001 | 060 | 500 | 48 |
| 002 | 120 | 500 | 48, 59 |
| 003 . . . | | Rinse-dry sequence. | |

Basically, program O3striphot2 provides that the wafers are treated as follows:
In step 0, function 48 is called to dispense a total of 7.6 liters/min of approximately 95° C. hot DI from the hot wafer rinse ports on the center spray post for 60 seconds. The turn table carrying the wafers is rotating at 60 rpm.
In step 1, the hot DI continues to dispense for 60 seconds and the turn table is accelerated to 500 rpm.
In step 2, function 59 called to activate the fourteen (14) liters/min flow of DIO for 120 seconds. Simultaneously, functions 48 continue to dispense 7.6 liters/min of hot DI on the wafers.
Step 3 and following are the standard Rev H B Clean rinse-dry program sequence for FSI MERCURY® MP spray tools.

Program O3striphot3 for the strip experiments conducted with the MP-D processor was as follows:

| Step | Time (secs) | RPM | Output Functions |
|---|---|---|---|
| 000 | 120 | 500 | 59 |
| 001 . . . | | Rinse-dry sequence. | |

Program O3striphot3 does not call for the dispensing of hot deionized water and thus, the wafers processed utilizing this program served as controls for the strip experiments conducted in the MP-D processor. Basically, program O3striphot3 provides that the wafers are treated as follows:
In step 0, function 59 called to activate the fourteen (14) liters/min flow of DIO for 120 seconds. No hot water is used before or during the DIO dispense step.
Step 1 and following are the standard Rev H B Clean rinse-dry program sequence for FSI MERCURY® MP spray tools.

Program O3striphot4 for the strip experiments conducted with the MP-D processor was as follows:

| Step | Time (secs) | RPM | Output Functions |
|---|---|---|---|
| 000 | 060 | 060 | 38 |
| 001 | 060 | 500 | 38 |
| 002 | 120 | 500 | 38, 59 |
| 003 . . . | | Rinse-dry sequence. | |

Basically, program O3striphot4 provides that the wafers are treated as follows:
In step 0, function 38 is called to dispense a total of 3.4 liters/min of approximately 95° C. hot DI from the hot line rinse ports on the center spray post for 60 seconds. The turn table carrying the wafers is rotating at 60 rpm.
In step 1, the hot DI continues to dispense for 60 seconds and the turn table is accelerated to 500 rpm.
In step 2, function 59 called to activate the fourteen (14) liters/min flow of DIO for 120 seconds.

Simultaneously, functions 38 continue to dispense 3.4 liters/min of hot DI on the wafers.

Step 3 and following are the standard Rev H B Clean rinse-dry program sequence for FSI MERCURY® MP spray tools.

Program O3striphot5 for the strip experiments conducted with the MP-D processor was as follows:

| Step | Time (secs) | RPM | Output Functions |
|------|-------------|-----|------------------|
| 000 | 060 | 060 | 26, 38, 48 |
| 001 | 060 | 500 | 26, 38, 48 |
| 002 | 120 | 500 | 26, 38, 48, 59 |
| 003 . . . | | Rinse-dry sequence. | |

Basically, program O3striphot5 provides that the wafers are treated as follows:

In step 0, functions 38 and 48 are called to dispense a total of 10.4 liters/min of approximately 86° C. hot DI from the hot wafer rinse and hot line rinse ports on the center spray post for 60 seconds. Function 26 blocks an alternate path for the hot water which increases the flow of hot DI to the wafers. The turn table carrying the wafers is rotating at 60 rpm.

In step 1, the hot DI continues to dispense for 60 seconds and the turn table is accelerated to 500 rpm.

In step 2, function 59 called to activate the fourteen (14) liters/min flow of DIO for 120 seconds. Simultaneously, functions 38, 48 and 26 combine to dispense 10.4 liters/min of hot DI on the wafers.

Step 3 and following are the standard Rev H B Clean rinse-dry program sequence for FSI MERCURY® MP spray tools.

Figure 3:
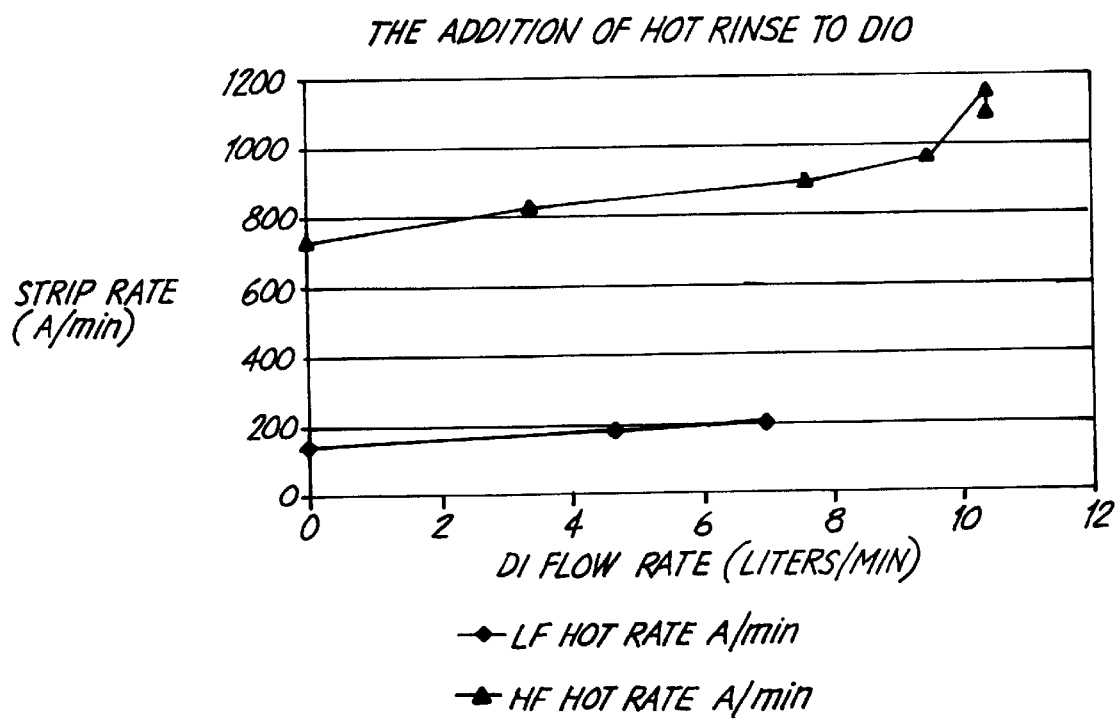
FIG. 3 is a graphical depiction of the effect on strip rate when both a heated liquid and a separate processing liquid are used to treat a substrate.

Table 1 shows the run conditions utilized for the 10 different strip experiments. FIG. 3 gives a graphical representation of the data in Table 1.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims

What is claimed is:

1. A method of treating a substrate comprising the steps of
causing a heated liquid to contact the substrate in a manner effective to heat at least a portion of the substrate; and
causing a processing liquid to contact the heated substrate,
wherein the processing liquid comprises a heat sensitive agent at least partially dispersed or dissolved in a solvent, and wherein the processing liquid and the heated liquid are provided as separate liquids.

2. The method of claim 1, wherein the heat sensitive agent is selected from the group consisting of an acid, a base, a detergent, an etchant, an oxidant, a cleaning agent, a stripping agent, a catalyst, and an enhancing agent.

3. The method of claim 1, wherein the heat sensitive agent comprises ozone.

4. The method of claim 3, wherein the solvent comprises water or ultrapure deionized water.

5. The method of claim 1, wherein the heated liquid comprises water or ultrapure deionized water.

6. The method of claim 5, wherein the heated liquid comprises ultrapure deionized water.

7. The method of claim 6, wherein the heated liquid is at a temperature of from about 30° C. to about 1° C. less than the boiling point of the heated liquid prior to contacting the heated surface.

8. The method of claim 1, wherein the processing liquid is at substantially ambient temperature.

9. The method of claim 1, wherein the substrate is an in-process semiconductor wafer.

TABLE 1

Run conditions for individual runs and data for FIG. 3.

| Run | Tool | Recipe | Hot DI Pre Heat | DIO Flow l/min | Average Hot DI Flow l/min | Hot DI Temp Deg. C. | Etch Rate A/min | Comments |
|-----|------|--------|-----------------|----------------|---------------------------|---------------------|-----------------|----------|
| 1 | MP-B | I-1 | N | 2 | 0 | 95 | 146 | Baseline low-flow recipe (BLF) |
| 2 | MP-B | I-3 | Y | 2 | 4.662 | 95 | 185 | BLF + Intermittent HWR |
| 3 | MP-B | I-2 | Y | 2 | 7 | 95 | 205 | BLF + HWR |
| 4 | MP-B | I-2 | Y | 2 | 7 | 95 | 197 | BLF + HWR |
| 5 | MP-D | O3striphot3 | N | 14 | 0 | 95 | 727 | Baseline high-flow recipe (BHF) |
| 6 | MP-D | O3striphot4 | Y | 14 | 3.4 | 95 | 820 | BHF + HLR |
| 7 | MP-D | O3striphot2 | Y | 14 | 7.6 | 95 | 888 | BHF + HWR |
| 8 | MP-D | O3striphot1 | Y | 14 | 9.5 | 80 | 950 | BHF + HWR + HLR |
| 9 | MP-D | O3striphot5 | Y | 14 | 10.4 | 86 | 1137 | BHF + HWR + HLR + MBP |
| 10 | MP-D | O3striphot5 | Y | 14 | 10.4 | 86 | 1081 | BHF + HWR + HLR + MBP |

As is shown in Table 1 and FIG. 3, the addition of a 7 liter/min flow of 95° C. hot deionized water to a low flow rate (2 liters/min) of 60 ppm ozonated deionized water resulted in an increase in strip rate of up to 38%, as compared to the etch rate achieved with the ozonated deionized water along (See runs 1 and 3 in Table 1, above). Furthermore, the addition of a 10.4 liter/min flow 95° C. hot deionized water to a high flow rate (14 liters/min) of 60 ppm ozonated deionized water resulted in a monotonic increase in strip rate of up to approximately 50% (See runs 5 and 9 in Table 1, above).

10. The method of claim 9, wherein a surface of the substrate comprises a photoresist material.

11. The method of claim 9, wherein a surface of the substrate comprises an organic contaminant.

12. The method of claim 10, wherein the surface is a top surface of an in-process semiconductor wafer.

13. The method of claim 10, wherein the surface is a bottom surface of an in-process semiconductor wafer.

14. A method of treating a plurality of substrates comprising the steps of:
positioning the substrates in a processing chamber;

causing a spray of a heated liquid to contact the plurality of substrates in a manner effective to heat at least a portion of the plurality of substrates; and causing a spray of a processing liquid to contact the plurality of substrates, wherein the processing liquid comprises a heat sensitive agent at least partially dispersed or dissolved in a solvent, and wherein the processing liquid and the heated liquid are provided as separate liquids.

15. The method of claim 14, wherein the step of causing a spray of a heated liquid to contact the plurality of substrates and the step of causing a spray of the processing liquid to contact the plurality of substrates are repeated one or more times.

16. The method of claim 14, wherein at least a portion of the step of causing a spray of a heated liquid to contact the plurality of substrates and a portion of the step of causing a spray of a processing liquid to contact the plurality of substrates occur at the same time.

17. The method of claim 14, wherein the flow rate of the spray of processing liquid is from about 1 liter per minute to about 20 liters per minute prior to contacting the plurality of substrates.

18. The method of claim 14, wherein the flow rate of the spray of heated liquid is from about 5 liters per minute to about 15 liters per minute prior to contacting the plurality of substrates.

19. The method of claim 14, wherein the spray of processing liquid is caused to contact the plurality of substrates at an inclined angle relative to at least one surface of each of the plurality of substrates.

20. The method of claim 14, wherein the spray of heated liquid is caused to contact the plurality of substrates at an inclined angle relative to at least one surface of each of the plurality of substrates.

21. The method of claim 19, wherein the spray of heated liquid is caused to contact the plurality of substrates at an inclined angle relative to at least one surface of each of the plurality of substrates.

22. The method of claim 14, wherein each of the plurality of substrates comprise a top surface and a bottom surface and wherein the heated liquid is caused to contact the bottom surface of each of the plurality of substrates and the processing liquid is caused to contact the top surface of each of the plurality of substrates.

23. The method of claim 14, wherein the heated liquid and the processing liquid are delivered from a location central to the position of the plurality of substrates and the plurality of substrates are caused to rotate about the central location.

* * * * *